United States Patent

Gabara

[11] Patent Number: 5,483,207
[45] Date of Patent: Jan. 9, 1996

[54] ADIABATIC MOS OSCILLATORS

[75] Inventor: Thaddeus J. Gabara, Murray Hill, N.J.

[73] Assignee: AT&T Corp., Murray Hill, N.J.

[21] Appl. No.: 367,525

[22] Filed: Dec. 30, 1994

[51] Int. Cl.⁶ .............................. H01L 27/04; H03B 5/12
[52] U.S. Cl. .................... 331/117 FE; 331/36 L;
  331/103; 331/181; 331/DIG. 3; 257/531;
  327/566
[58] Field of Search ........................ 331/36 L, 45,
  331/57, 60, 103, 117 R, 117 FE, 173, 181,
  DIG. 3; 257/531; 327/566

[56] References Cited

FOREIGN PATENT DOCUMENTS 2211987  7/1989  United Kingdom .................. 257/531

*Primary Examiner—David Mis*

[57] ABSTRACT

High-frequency, low-power CMOS oscillators having electrically-tunable tank circuits are disclosed. Electrically-tunable inductors assure highly efficient oscillator operation and can be adjusted after manufacture to assure high yields of high-precision oscillator circuits.

3 Claims, 4 Drawing Sheets

ADIABATIC MOS OSCILLATORS

BACKGROUND OF THE INVENTION

1. Field of the Invention

The present invention pertains to MOS oscillators suitable for VLSI structures. More particularly, the present invention pertains to adiabatic MOS oscillator operation.

2. Discussion of Related Art

Personal communication system (PCS) devices such as cellular phones are playing an increasingly important role in the consumer electronics marketplace. Structures using MOS and CMOS technology are advantageous for such circuits because of their small size and low power consumption characteristics.

MOS ring oscillators are well known. However, their capacitive loading, and the resulting power dissipation and thermal instability, are unattractive. Also, the operating frequency of these oscillators is set by resistively varying the bias voltage applied to each inverter in the ring. However, as is well known, resistively varying the frequency of oscillators causes their power consumption to increase as their output frequency increases.

Conventional MOS ring oscillators also require an inverter string at the output in order to scale up the capacitance needed to maintain oscillation in the ring to the larger capacitance of the ouput driver transistor needed to isolate the ring from relatively large impedances, such as 50 ohm transmission lines. However, the parasitic gate capacitances of the inverter strings themselves add substantially to the load on the oscillator, causing the strings to dissipate substantial power before the oscillator output is delivered to the load, as much as one-third of the power delivered by the ring.

The power dissipation occurring in the output strings of ring oscillators is avoided entirely when the MOS oscillator is implemented using a tank circuit, which uses the capacitance to maintain its oscillation. However, this requires the integration of passive elements into the circuit.

Passive elements have been formed in integrated circuits. N. Nguyen and R. Meyer, "Si IC-Compatible Inductors and compatible LC Passive Filters", *IEEE Journal Solid State Circuits*, vol. 25, no. 4, pp. 1028–1031, August 1990, describes bipolar circuits that include integrated inductors. The process used for fabricating bipolar circuits is, in general, not compatible with CMOS fabrication. Also, because of their characteristic power constraints, bipolar devices require more "real estate" on the chip, generate substantially more heat and lack the low-power performance capability of CMOS devices. Therefore they are less suitable for VLSI structures, generally.

J. Chang, A. Abidi and M. Gaitan, "Large Suspended Inductors on Silicon and their use in a 2-micron CMOS Rf Amplifier", *IEEE Electronic Device Letters*, vol. 14, no. 5, pp. 246–248, May 1993, discloses an integrated tank structure for CMOS where the silicon under a glass passivation layer that supports the inductor metalization is etched away to reduce power losses in the integrated inductor. This complicates device fabrication, adding an extra step. Also, in their manufacture, the actual resonant frequency of integrated tank circuits vary. To operate at a given frequency, these tank circuit must be resistively tuned and, consequently, they are inefficient.

Small size and relatively low power consumption make CMOS potentially advantageous for use in cellular telephones and other personal communication systems (PCSs). However, highly-doped substrates used in CMOS fabrication would cause unacceptably high power loss if the integrated inductors used in bipolar circuits were implemented in MOS structures, and the high cost of integrating passive devices into MOS circuit fabrication, even in lightly-doped structures, and the power loss encountered in capacitance-matching for ring oscillators and in tuning CMOS oscillators, generally, has made their use in PCS devices problematic.

SUMMARY OF THE INVENTION

An oscillator circuit in accordance with the present invention comprises an electrically-tunable mirror-inductance, which permits operation of the oscillator at its actual resonance point, where the operation of the oscillator is highly efficient.

In a particular embodiment, the tank of an MOS Colpitts oscillator includes a mirror-tuned electrically variable inductance. The tank circuit provides the capacitance matching needed to directly drive capacitive loads, such as the dipole antennas used in personal communication system (PCS) devices, and the driver transistors needed to isolate low-impedance loads such as transmission lines.

Moreover, the interaction of the inversion region of the gate in large-area MOS transistor with a respective spiral metallization integral with the chip that overlies the oxide covering the transistor's polysilicon gate, provides variable inductance in the preferred embodiment of apparatus in accordance with the present invention. These variable inductances are controlled by the application of a potential to the respective gate, which causes an inversion layer to be formed under the gate and decreases the depth of the induced flux under the gate thereby decreasing the device's inductance.

This variable inductance permits precise reactive-tuning of the oscillator, which avoids the damping of the output signal that occurs in resistive tuning. The adjustability of this oscillator, in turn, assures higher manufacturing yields.

In a further embodiment, the parasitic gate capacitance of an MOS coupled-tank inverter oscillators is coupled so as to be operatively part of the oscillator's overall LC tank circuit.

In particular, the reliable, low-loss operation permitted by these reactively-tuned oscillator circuits make the advantageous features of CMOS oscillators available for use in PCS's such as cellular phones.

BRIEF DESCRIPTION OF THE DRAWINGS

The features and advantages of the present invention will be better understood when the detailed description of a preferred embodiment given below is considered in conjunction with the drawings provided, wherein.

In these figures, like reference numerals indicate similar structures.

DETAILED DESCRIPTION OF PREFERRED EMBODIMENTS

Figure 1:
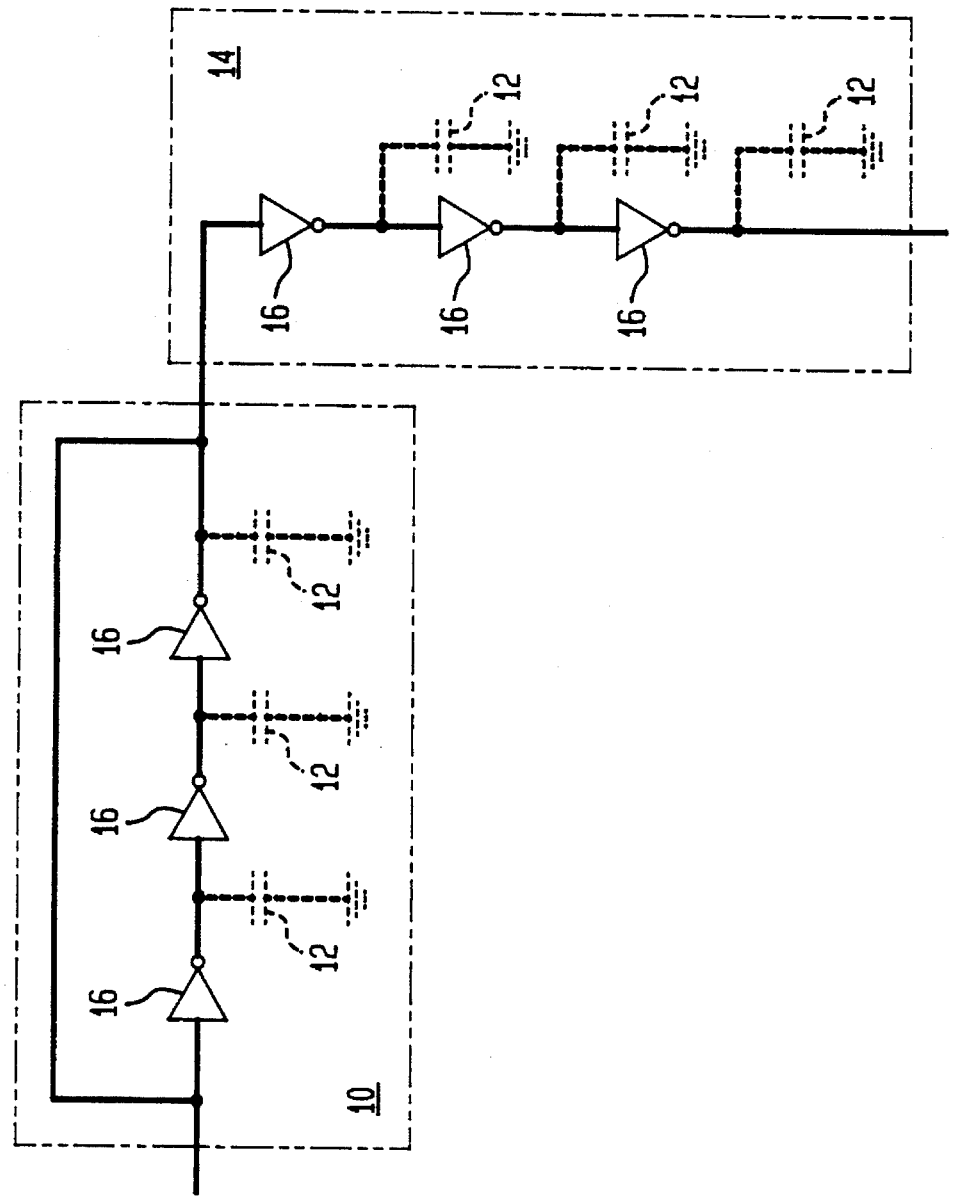
FIG. 1 is a circuit diagram of a conventional prior-art CMOS ring oscillator.

FIG. 1 shows a conventional prior art CMOS ring oscillator 10. The parasitic gate capacitances 12, shown in phantom, of the ring 10 and the inverter string 14 are a cumulative load that limits both the oscillator's power output and frequency of operation that can be provided. This can be eliminated by using oscillator devices having reactively-tuned tank circuits.

Figure 2A:
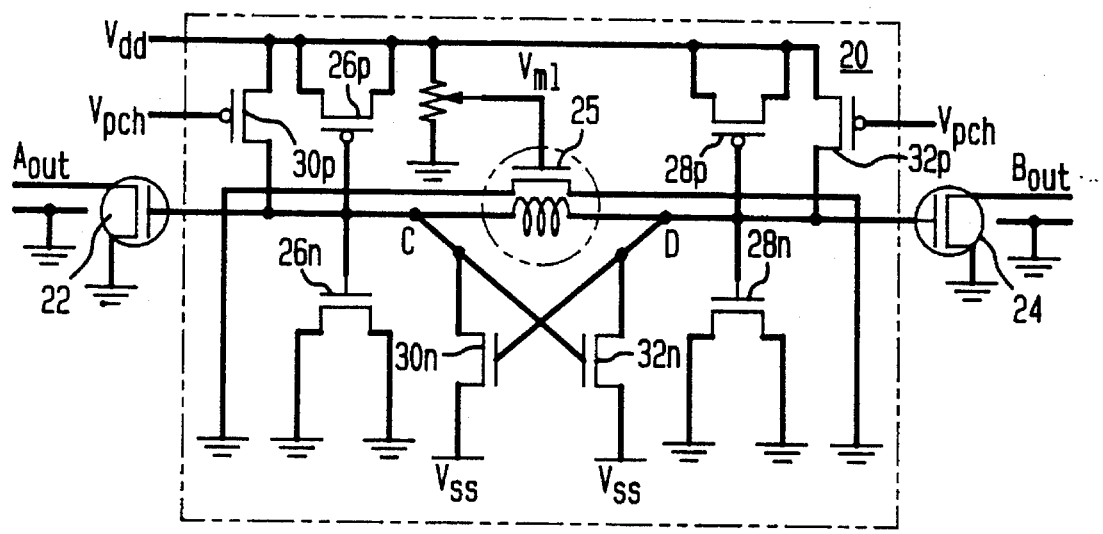
FIGS. 2*a* through 2*d* are diagrams showing details of a Colpitts-type oscillator circuit having a tank circuit that is electrically-tuned in accordance with the present invention.

The Colpitts-type CMOS oscillator 20 shown in FIG. 2a is similar to that described in T. Gabara, K. Tai, M. Lau, S. Pei, R. Frye and P. Sullivan, "A 27 mW CMOS RF Oscillator Operating at 1.2 GHz", 1994 *IEEE Multi-Chip Conference*, pp. 15–19. However, in FIG. 2a, the [resonant] frequency of the tank circuit is electrically controlled. To maintain near-zero impedance in the tank circuit the reactance of the inductor 25 can be varied by adjusting the voltage $V_{ml}$ applied to the gate of a large-area FET transistor 34. $V_{ml}$ is derived from $V_{dd}$, and the effective value of the variable inductance is: $L=f(V_{ml})$.

Figure 2B:
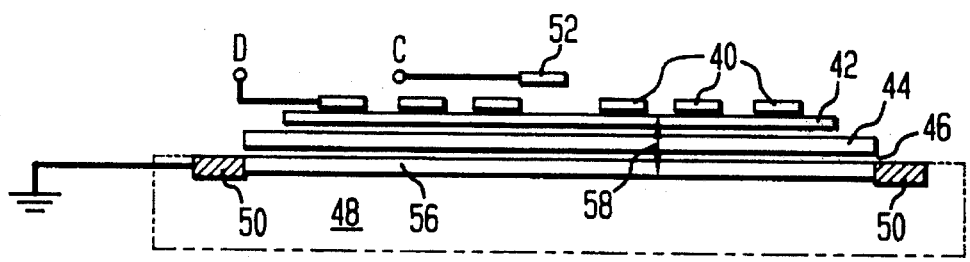
Figure 2C:
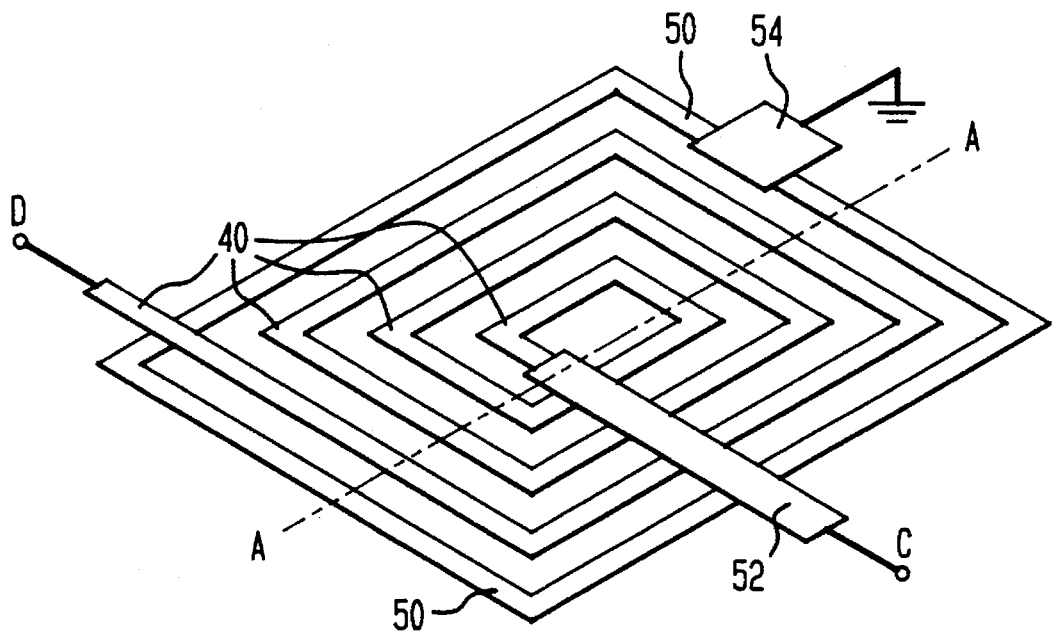

FIG. 2b is a cross-section of the inductor 25 taken at line A—A on FIG. 2c. The spiral metallization 40 is applied to an insulative oxide layer 42 over the polysilicon gate electrode 44 that is connected to the control voltage $V_{ml}$. The spiral 40 is connected between junctions "C" and "D" in FIG. 2a.

The lightly-doped polysilicon gate electrode 44 is deposited on a 100–150 Angstrom thin-oxide layer 46 overlying a P-tub layer 48. The gate electrode 44 is deposited in an area within a circumferential n-channel deposit 50. Junction "D" and the control voltage $V_{ml}$ are connected to the spiral coil 40 and the gate electrode 44, respectively, by interlayer vias that contact leads 52 and 54.

When a control voltage $V_{ml}$ of a few-hundred millivolts is applied to the gate electrode 44, a conductive inversion layer 56 is formed in the p-tub layer 48 beneath the polysilicon gate 44. The conductivity of this conductive inversion layer 56, its effective "thickness", is varied by the application of a control voltage $V_{ml}$ at and near the threshhold voltage of the gate. Current in the spiral coil 40 will induce a current in the grounded, 150-angstrom thick, inversion layer 56 electro-magnetically linked to it, as indicated by the arrow 58.

The charge-carrier concentration in this inversion layer 56 increases exponentially as the applied voltage increases, providing the increased conductivity. When the inversion layer is at maximum conductivity, the inductance of the coil is minimum.

Figure 2D:
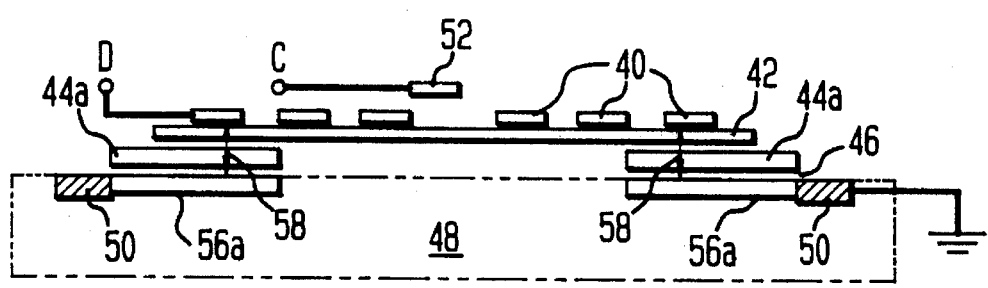

It is important to note, however, that the transition to and from that state of maximum conductivity is a non-linear function of the applied voltage near the threshhold of the gate. Also, the more charge carriers in the inversion layer, the lower its resistance is, and the greater the attendant losses per unit area. However, these losses and this non-linear variation in the inductance of the 3.5-turn, 380-micron$^2$ coil shown in FIGS. 2b and 2c, from 3.6 nH to 0 nH, can be controlled by the use of a modified "doughnut" mirror-inductor shown in FIG. 2d where the area of the gate has been reduced to the rim area of the spiral metalization. This limits the non-linear variation to a minimum value of 1.4 nH, the equivalent of a 2-turn, 270-micron$^2$ inductor, so as to implement tuning in a somewhat more controlled fashion.

In a preferred embodiment, the tank capacitors are complementary monolithic capacitors. The source and drain of the n-channel half 26n, 28n is connected to $V_{ss}$ and the p-channel half 26p, 28p is connected to $V_{dd}$. This type of CMOS capacitor has been implemented with values up to 11 pF, determined by the gate area of the respective side of the capacitor.

The use of a complementary monolithic capacitive element provides greater manufacturing uniformity and thermal stability than conventional, non-paired thin-ox capacitors. The operation of the p-channel capacitor in this circuit is particularly advantageous as a damper, balancing out the variation in the gate capacitance of large n-channel driver transistors whose gate capacitance varies with the voltage output by the transistor.

Resistive tuning is available in FIG. 2a through the variable resistance connected in series with $V_{dd}$ through respective gates 30, 32, in response to control voltage $V_{pch}$ applied to the gates 30, 32. However, in accordance with the present invention, electrically-variable inductors control the frequency of oscillation, in response to the control voltage $V_{ml}$.

A 1.2 GHz Hartley-type free-running oscillator 60, such as that disclosed in the co-pending, commonly-assigned U.S. patent application of Thaddeus J. Gabara, Ser. No. 08/165,433, filed Dec. 13, 1993, incorporated herein by reference, may also be modified to provide reactive tuning in accordance with the present invention. The Hartley oscillator has two transistors having respective gates cross-coupled to the opposing drain on opposite ends of a capacitor, between output buffers and tank inductors. Thus it is substantially the inverse of the Colpitts oscillator tank shown in FIG. 2a.

Figure 3:
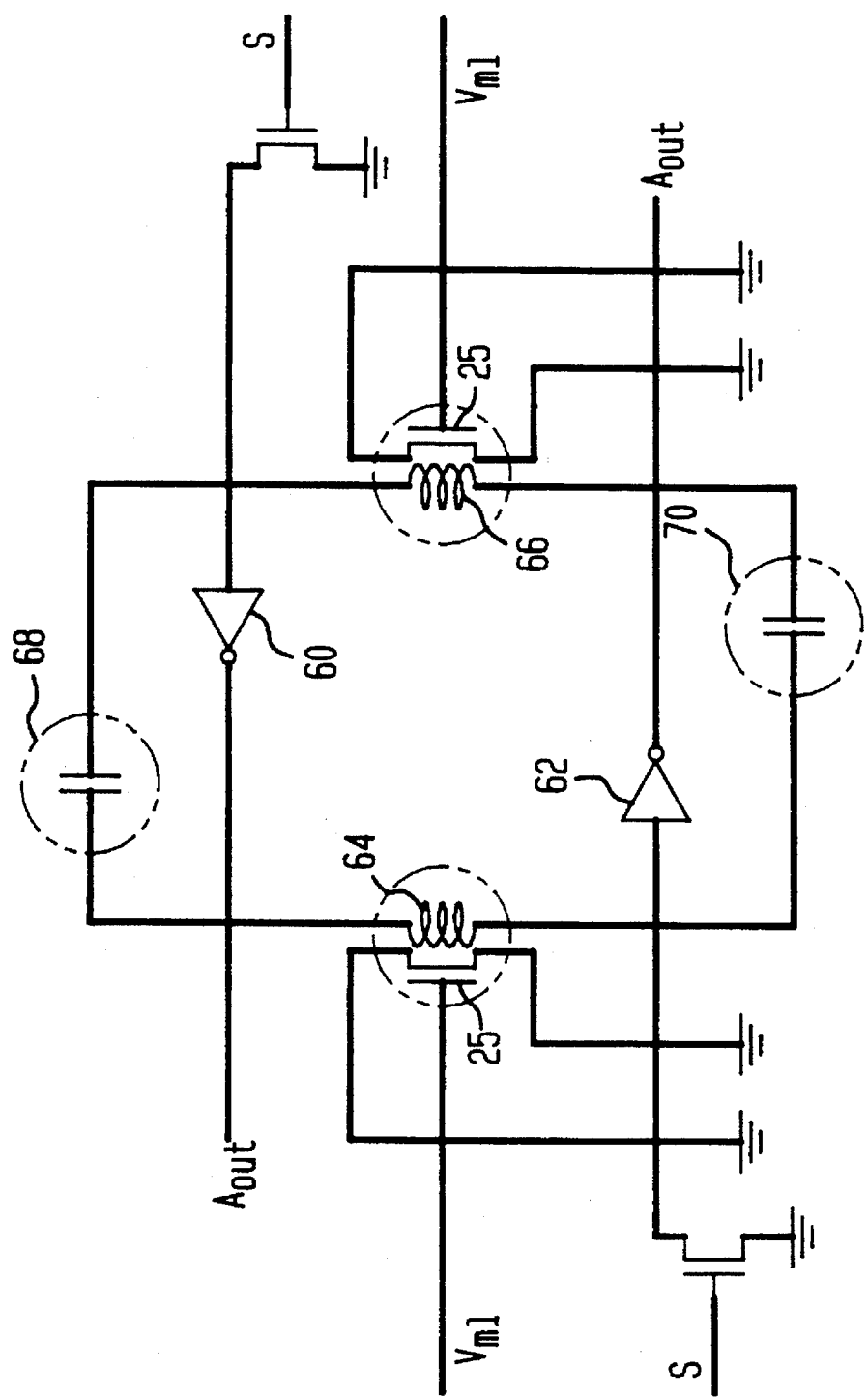
FIG. 3 is a circuit diagram of a cross-coupled inverter oscillator having mirror-tuned inductors in accordance with the present invention.

In the coupled-tank oscillator in FIG. 3, two inverters 60, 62, are connected, input-to-output, by inductances 64, 66, and a capacitance 68, 70, acting in parallel with each inverter that may be, simply, the inverter's gate capacitance. Alternatively, the capacitance connected across each inverter may include a parallel metalization capacitor of any suitable type well-known in the art. This permits 0.9-micron CMOS oscillators to produce frequencies up to 10× higher than conventional CMOS circuits.

It will be appreciated by one skilled in the art that variations and modifications of the disclosed apparatus are possible within the spirit and scope of this invention. For example, the oscillators could be implemented in multi-chip modules (MCM's). The embodiments described above illustrate presently preferred ways of making and using this invention. The invention is defined by the claims appended below.

I claim:

1. An electrically-tunable inductor element, said element comprising:
   an inductor element; and
   a transistor having a charge inversion area electro-magnetically linked to said inductor element, whereby the inductance of said inductor element can be varied by varying the voltage applied to the transistor gate.

2. An electrically-tunable inductor element, said element comprising:
   an inductive metalization element; and
   a transistor having a charge inversion area electro-magnetically linked to a portion of said inductor element, whereby a portion of the inductance of said inductor element can be varied by varying the voltage applied to the transistor gate.

3. An MOS oscillator device having a tank circuit, said tank circuit comprising:
   an element providing capacitance; and
   an electrically-tunable inductor device, said device having— an inductor element and a transistor having a charge inversion area electro-magnetically linked to said inductor element, whereby the resonant frequency of said tank can be reactively tuned.

\* \* \* \* \*